(12) United States Patent  
Rofougaran

(10) Patent No.: US 8,014,740 B2
(45) Date of Patent: *Sep. 6, 2011

(54) METHOD AND SYSTEM FOR AMPLITUDE CALIBRATION FOR POLAR MODULATION WITH DISCONTINUOUS PHASE

(75) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 675 days.

This patent is subject to a terminal disclaimer.

(21) Appl. No.: 11/872,767

(22) Filed: Oct. 16, 2007

(65) Prior Publication Data

US 2009/0033415 A1 Feb. 5, 2009

Related U.S. Application Data

(60) Provisional application No. 60/953,137, filed on Jul. 31, 2007.

(51) Int. Cl.
*H01Q 11/12* (2006.01)
*H04K 3/00* (2006.01)

(52) U.S. Cl. ................................. 455/127.3; 330/133

(58) Field of Classification Search ............... 455/115.1, 455/127.1, 127.3; 330/133, 278, 285
See application file for complete search history.

(56) References Cited

U.S. PATENT DOCUMENTS

| | | | |
|---|---|---|---|
| 6,681,101 B1 * | 1/2004 | Eidson et al. | 455/127.1 |
| 7,551,026 B2 * | 6/2009 | Rofougaran | 330/133 |
| 7,602,242 B2 * | 10/2009 | Rofougaran | 330/133 |
| 7,659,779 B2 * | 2/2010 | Rofougaran | 330/133 |

* cited by examiner

*Primary Examiner* — Lee Nguyen

(74) *Attorney, Agent, or Firm* — McAndrews, Held & Malloy, Ltd.

(57) ABSTRACT

Aspects of a method and system for amplitude calibration for polar modulation with discontinuous phase may include amplifying a signal via a plurality of amplifiers such that a combined gain of the plurality of amplifiers comprises a coarse amplitude gain, an amplitude offset gain and a calibration gain. A gain of one or more of the plurality of amplifiers may be adjusted to set the coarse amplitude gain, and a gain of one or more remaining ones of the plurality of amplifiers may be adjusted to set the amplitude offset gain and the calibration gain. The setting of the coarse amplitude gain, the calibration gain and/or said amplitude offset gain may be adjusted dynamically and/or adaptively.

20 Claims, 5 Drawing Sheets

METHOD AND SYSTEM FOR AMPLITUDE CALIBRATION FOR POLAR MODULATION WITH DISCONTINUOUS PHASE

CROSS-REFERENCE TO RELATED APPLICATIONS/INCORPORATION BY REFERENCE

This application makes reference to, claims priority to, and claims the benefit of U.S. Provisional Application Ser. No. 60/953,137, filed on Jul. 31, 2007.

The above referenced application is hereby incorporated herein by reference in its entirety.

FIELD OF THE INVENTION

Certain embodiments of the invention relate to signal processing for communication systems. More specifically, certain embodiments of the invention relate to a method and system for amplitude calibration for polar modulation with discontinuous phase.

BACKGROUND OF THE INVENTION

Polar Modulation is related to in-phase (I) and quadrature (Q) modulation in the same way that polar coordinates are related to the Cartesian coordinate system. For polar modulation, the orthogonal I and Q components of an RF signal are converted to a phasor representation comprising an amplitude component and a phase component. In this way, the combined I and Q signal may be generated with one phase change and one amplitude change, whereas separate I and Q modulation may require amplitude and phase modulation for each channel, especially for non-constant envelope modulation modes. In addition, the I and Q modulation approach may require good linearity of the power amplifier, often leading to power inefficient designs that suffer from parameter variability due to factors such as temperature. In contrast, polar modulation may allow the use of very efficient and non-linear amplifier designs for non-constant envelope modulation schemes.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for amplitude calibration for polar modulation with discontinuous phase, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for amplitude calibration for polar modulation with discontinuous phase. Aspects of a method and system for amplitude calibration for polar modulation with discontinuous phase may comprise amplifying a signal via a plurality of amplifiers such that a combined gain of the plurality of amplifiers comprises a coarse amplitude gain, an amplitude offset gain and a calibration gain. A gain of one or more of the plurality of amplifiers may be adjusted to set the coarse amplitude gain, and a gain of one or more remaining ones of the plurality of amplifiers may be adjusted to set the amplitude offset gain and the calibration gain.

The setting of the coarse amplitude gain, the calibration gain and/or the amplitude offset gain may be adjusted dynamically and/or adaptively. The gain of the one or more of the plurality of amplifiers associated with the coarse amplitude gain may switch between unity gain and an arbitrary fixed gain, and the gain of the one or more of the remaining ones of the plurality of amplifiers associated with the amplitude offset gain and the calibration gain may be variable and arbitrary or discrete. The corresponding amplifier or amplifiers associated with the amplitude offset gain and the calibration gain may comprise one or more analog amplifiers. The signal may be generated by phase-modulation of a radio-frequency carrier. The combined gain of the plurality of amplifiers may be controlled based on a desired amplitude modulation and a desired calibration. The calibration gain may be adjusted so to attenuate or mitigate the effects of signal distortion.

Figure 1:
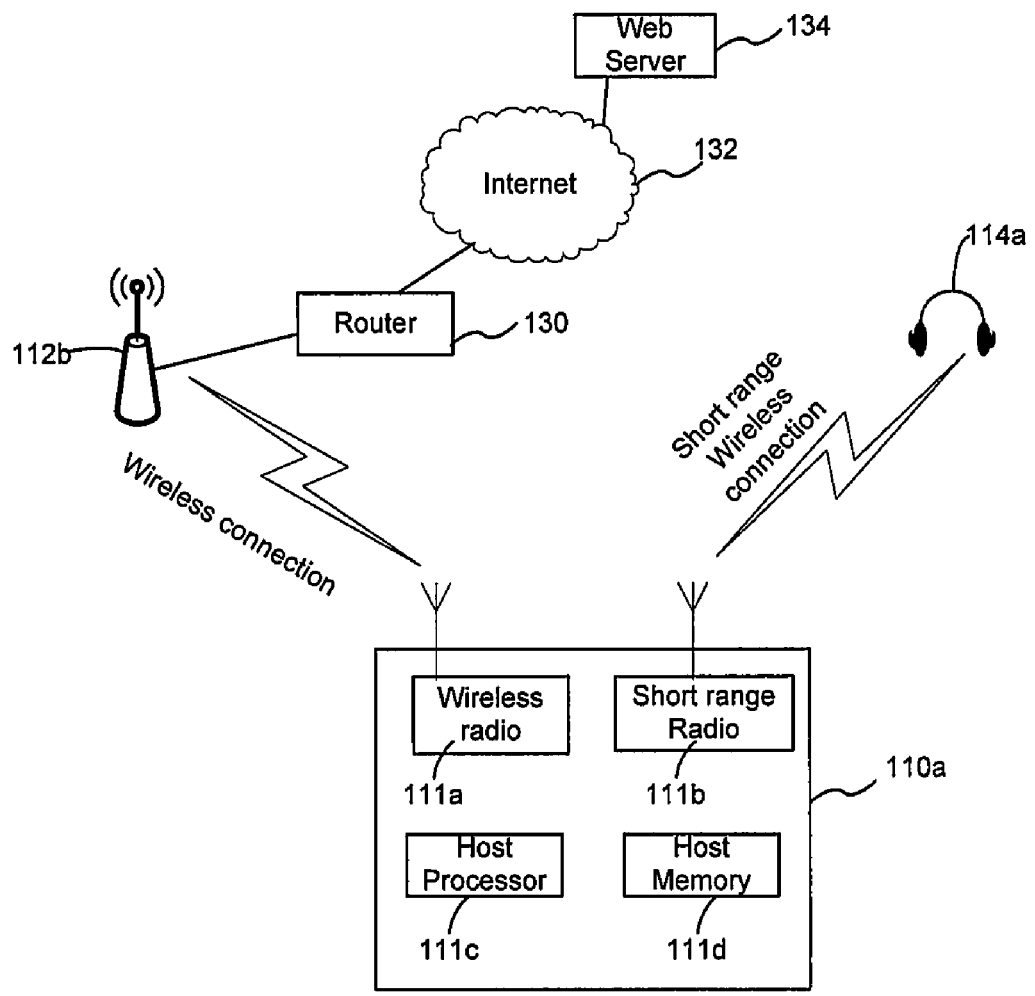
FIG. 1 is a diagram illustrating an exemplary wireless communication system, in accordance with an embodiment of the invention.

FIG. 1 is a diagram illustrating an exemplary wireless communication system, in accordance with an embodiment of the invention. Referring to FIG. 1, there is shown an access point 112b, a computer 110a, a headset 114a, a router 130, the Internet 132 and a web server 134. The computer or host device 110a may comprise a wireless radio 111a, a short-range radio 111b, a host processor 111c, and a host memory 111d. There is also shown a wireless connection between the wireless radio 111a and the access point 112b, and a short-range wireless connection between the short-range radio 111b and the headset 114a.

Frequently, computing and communication devices may comprise hardware and software to communicate using multiple wireless communication standards. The wireless radio 111a may be compliant with a mobile communications standard, for example. There may be instances when the wireless radio 111a and the short-range radio 111b may be active concurrently. For example, it may be desirable for a user of the computer or host device 110a to access the Internet 132 in order to consume streaming content from the Web server 134. Accordingly, the user may establish a wireless connection between the computer 110a and the access point 112b. Once this connection is established, the streaming content from the Web server 134 may be received via the router 130, the access point 112b, and the wireless connection, and consumed by the computer or host device 110a.

It may be further desirable for the user of the computer 110a to listen to an audio portion of the streaming content on the headset 114a. Accordingly, the user of the computer 110a may establish a short-range wireless connection with the headset 114a. Once the short-range wireless connection is established, and with suitable configurations on the computer enabled, the audio portion of the streaming content may be consumed by the headset 114a. In instances where such advanced communication systems are integrated or located within the host device 110a, the radio frequency (RF) generation may support fast-switching to enable support of multiple communication standards and/or advanced wideband systems like, for example, Ultrawideband (UWB) radio. Other applications of short-range communications may be wireless High-Definition TV (W-HDTV), from a set top box to a video display, for example. W-HDTV may require high data rates that may be achieved with large bandwidth communication technologies, for example UWB and/or 60-GHz communications. High-rate data communications by the computer 110a, both in the wireless radio 111a and the short-range radio 111b, may require high-order physical layer modulation. For example, quadrature amplitude modulation (QAM) may be used in constellations of 16 points (16-QAM), 64 points (64-QAM) or higher. Such higher order modulation schemes may offer very high spectral efficiency when the signal-to-noise-ratio may be sufficiently high between the computer 110a and/or the access point 112b. The host device 110a may, for example, use polar modulation for the wireless radio 111a and/or the short-range radio 111b, in accordance with various embodiments of the invention and as is further is described below.

Figure 2:
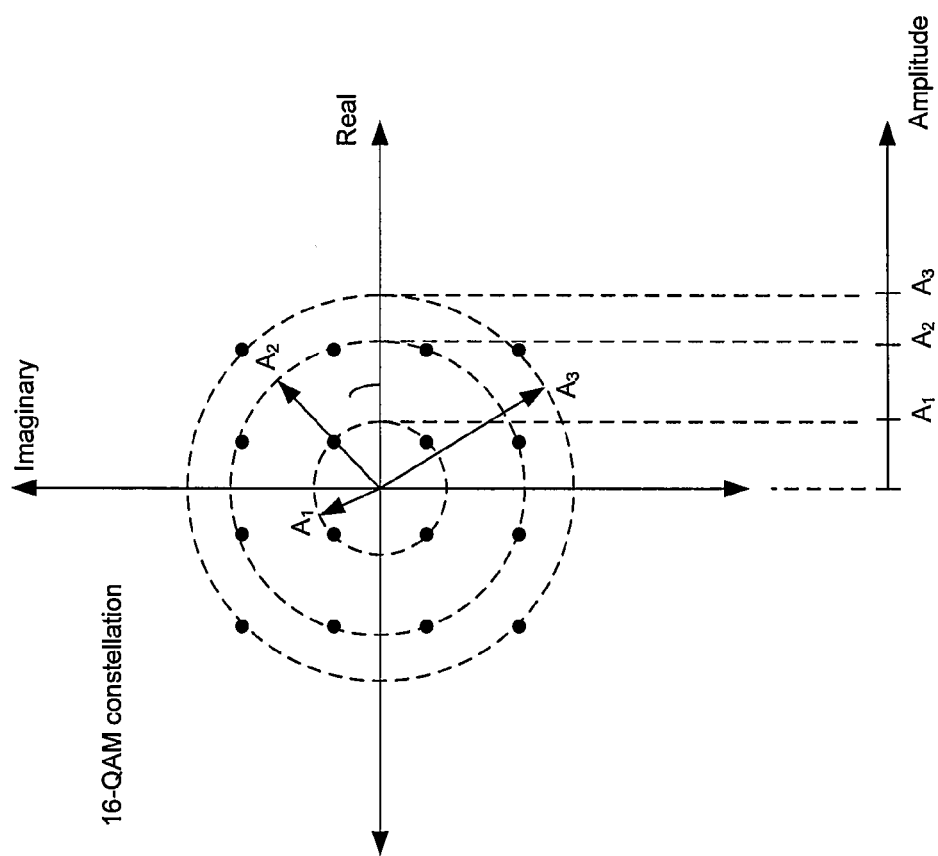
FIG. 2 is an exemplary constellation diagram illustrating a 16-QAM constellation diagram, in accordance with an embodiment of the invention.

FIG. 2 is an exemplary constellation diagram illustrating a 16-QAM constellation diagram, in accordance with an embodiment of the invention. Referring to FIG. 2, there is shown a real axis and an imaginary axis that may span the complex plane. There is also shown an amplitude axis. Each black dot may represent a given location in the complex plane and may be used for higher-order modulation. The black dots may be referred to as constellation points. In this instance, there may be 16 regularly arranged constellation points. In various other constellations, an arbitrary number of constellation points may be present. Each constellation point may be defined by an amplitude and a phase angle from the origin of the complex plane. In regularly arranged constellations, for example the one depicted in FIG. 2, a small set of amplitudes and angles may suffice to specify the entire set of constellation points. For example, it is illustrated by 3 dotted co-centric circles centered at the origin of the complex plane that all 16 constellation points may be associated with 3 different amplitudes, for example amplitudes $A_1$, $A_2$ and $A_3$. In many instances, the number of different amplitudes required may be much smaller than the number of constellation points.

Each circle that may illustrate one amplitude level, for example Amplitude levels $A_1$, $A_2$ and $A_3$, may be projected onto the amplitude axis and may be indicated there. For any number of constellation points and any constellation arrangement, the amplitude levels may be projected onto an amplitude axis as illustrated in FIG. 2.

A modulated transmit signal s(t) may be, for example, given by the following relationship:

$$s(t)=A(t)\cos(w_c t+\phi(t))=I(t)\cos(w_c t)+Q(t)\sin(w_c t) \quad (1)$$

where A(t) may be an amplitude and $\phi$(t) may be an angle modulated onto a carrier cos($w_c$t). The first form in equation (1) may be written in terms of an in-phase and quadrature component, I(t) and Q(t), respectively. The various signal components may be given by the following relationships:

$$I(t)=A(t)\cos(\phi(t))$$

$$Q(t)=A(t)\sin(\phi(t))$$

$$A(t)=\sqrt{I^2(t)+Q^2(t)}$$

$$\phi(t)=\tan^{-1}(Q(t)/I(t))$$

The amplitude A(t) and the phase $\phi$(t) may, as illustrated in FIG. 2, assume a discrete set of values.

Figure 3:
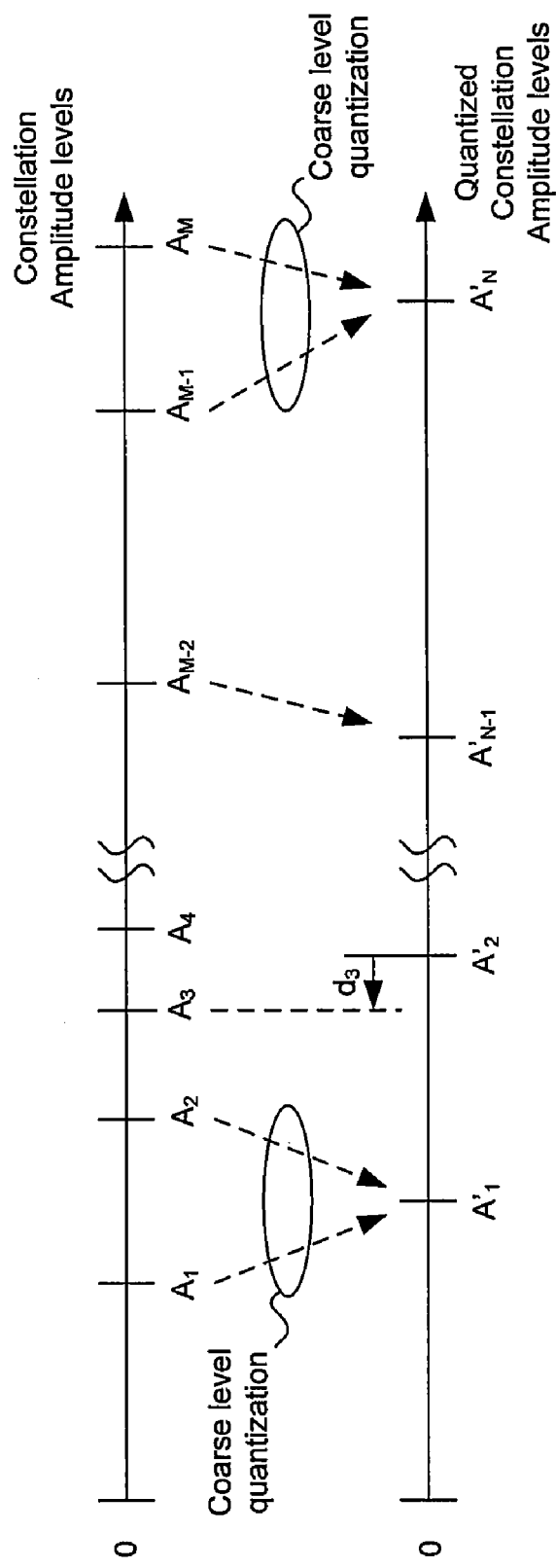
FIG. 3 is an exemplary amplitude diagram for a constellation diagram, in accordance with an embodiment of the invention.

FIG. 3 is an exemplary amplitude diagram for a constellation diagram, in accordance with an embodiment of the invention. Referring to FIG. 3, there is shown a constellation amplitude levels axis and a quantized constellation amplitude levels axis. The constellation amplitude levels axis may be similar to the amplitude axis in FIG. 2 and may be obtained from a constellation, for example, as illustrated in FIG. 2. In a general case, there may be M different amplitude levels for a certain constellation. There may be a plurality of amplitude levels, of which amplitude levels $A_1, A_2, A_3, A_4, A_{M-2}, A_{M-1}$, $A_M$ may be shown on the constellation amplitude levels axis.

With an increasing number of amplitude levels for a given constellation, it may become more efficient in some instances to implement N<M fixed amplitude levels together with, for example, an analog and continuous amplitude offset. In these instances, the set of amplitudes $\{A_1, A_2, \ldots A_M\}$ may be mapped onto a smaller set of amplitudes $\{A'_1, A'_2, \ldots, A'_N\}$. In addition, each amplitude may be associated with an offset value $d_k$, which may be used to define the amplitude level $A_k$ from a given level $A'_n$. Hence, the amplitudes may be related as illustrated in the following relationship:

$$A_k = A'_n + d_k; \forall k \in 1\ldots K; n \in 1,\ldots,N; N<K$$

Hence, the amplitudes $A'_n$ may be considered analogous to the quantization of the amplitudes $A_k$ with a quantization error $d_3$. An exemplary quantization process may be illustrated in FIG. 3. For example, the amplitude levels $A_k$ may be quantized, or associated with, a nearest level $A'_n$ on the quantized constellation amplitude levels axis. For example, the amplitude levels $A_1$ and $A_2$ may be quantized to $A'_1$, as illustrated. Similarly, the amplitude levels $A_{M-1}$, and $A_M$ may be quantized to $A'_N$, $A_{M-2}$ may be quantized to $A'_{N-1}$, etc.

For example, the amplitude level $A_3$ may be quantized to the quantized amplitude level $A'_2$. Associated with the amplitude level $A_3$ may also be an amplitude offset $d_3$.

Figure 4:
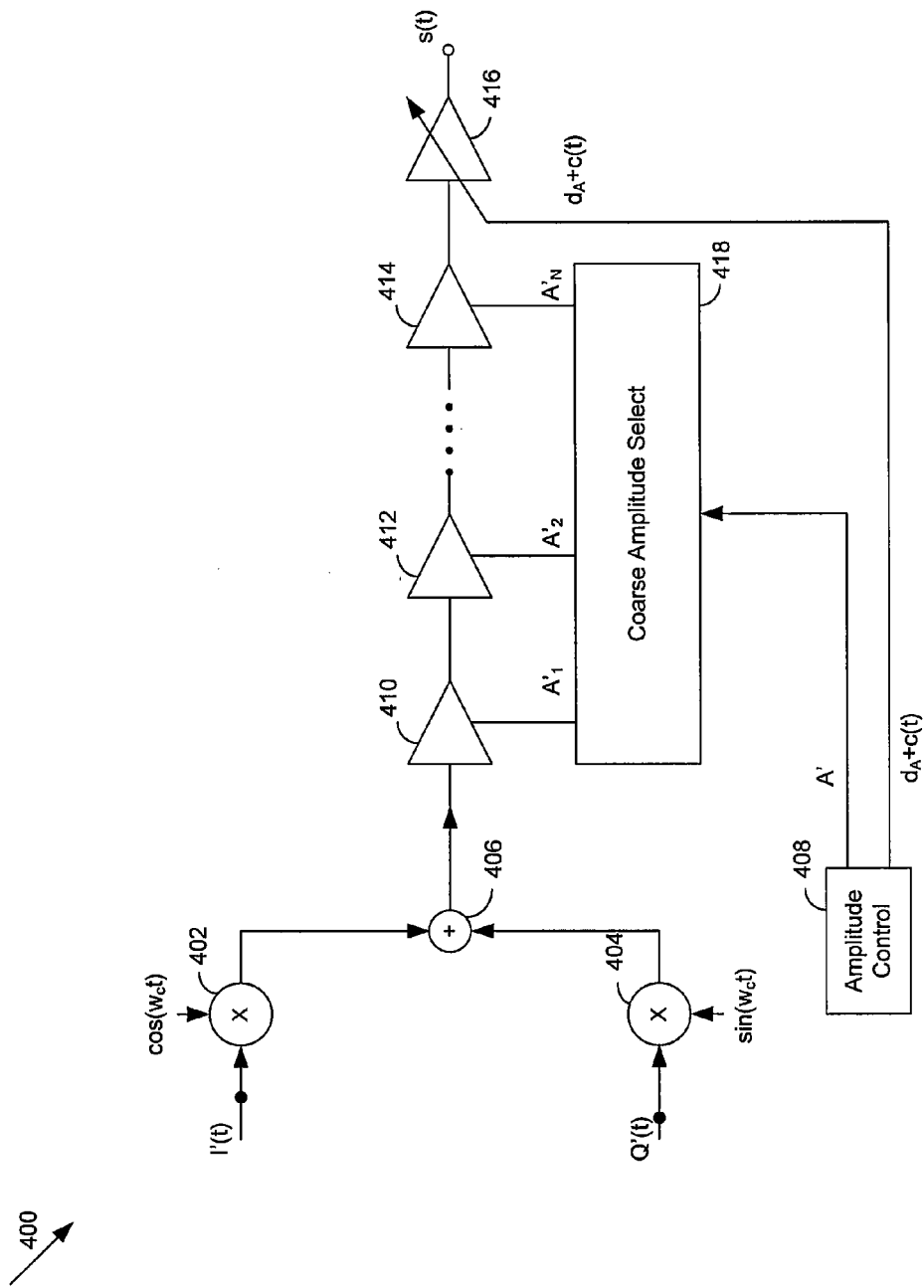
FIG. 4 is block diagram of an exemplary polar amplitude modulation system, in accordance with an embodiment of the invention.

FIG. 4 is block diagram of an exemplary polar amplitude modulation system, in accordance with an embodiment of the invention. Referring to FIG. 4, there is shown a polar amplitude modulation system 400, comprising multipliers 402 and 404, an adder 406, an amplitude control block 408, a plurality of amplifiers, of which amplifiers 410, 412, 414 and 416 may be illustrated, and a coarse amplitude select block 418. There is also shown a normalized in-phase signal I'(t), a normalized quadrature signal Q'(t), an in-phase carrier cos($w_c$t), a quadrature carrier sin($w_c$t), a quantized Amplitude A', quantized constellation amplitude levels $A'_1, A'_2$ and $A'_N$, an amplitude offset $d_A$, a calibration signal c(t), and a transmit signal s(t).

The normalized in-phase signal may be given by I'(t)=I(t)/A(t)=cos($\phi$). Similarly, the normalized quadrature signal may be given by Q'(t)=Q(t)/A(t)=sin($\phi$). The normalized in-phase signal I'(t) may be multiplied with an in-phase carrier cos ($w_c$t) in multiplier 402. The normalized quadrature signal Q'(t) may be multiplied with a quadrature carrier sin($w_c$t) in multiplier 404. In adder 406, the signals may be summed to generate an output signal at the adder 406 that may be given by the following relationship:

$$I'(t)\cos(w_c t)-Q'(t)\sin(w_c t)=\cos(w_c t+\phi) \quad (2)$$

In this instance, the output signal of the adder 406 may be a normalized version of the transmit signal s(t), as may be illustrated by comparing equation (2) with equation (1).

The coarse amplitude modulation may be achieved by enabling a desirable combination of amplifiers, for example amplifiers 410, 412 and 414. The amplitude control block 408 may comprise suitable logic, circuitry and/or code that may be enabled to generate output signals that may correspond to a quantized coarse amplitude level A'(t) and an amplitude offset $d_A$ as a function of a desired amplitude level. The quantized amplitude level may be communicatively coupled to the coarse amplitude select block 418. The coarse amplitude select block 418 may comprise suitable logic, circuitry and/or code that may be enabled to select the gain of the amplifiers 410, 412 and 414 to generate a desired amplitude levels. In one embodiment of the invention, the amplifiers 410, 412 and 414, for example, may be toggled between unit amplification and a suitable gain. In this instance, the quantized amplitude level $A'_1$, for example when $A'_1 < A'_2 < \ldots < A'_N$, may be achieved by setting amplifier 410 to a gain of $A'_1$ while all the other amplifiers may remain at unit gain. The gain $A'_2$, for example, may be set by setting a gain $A'_1$ in amplifier 410 and a gain of $A'_2 - A'_1$ in amplifier 2 while the other amplifiers may remain at unit gain. Similarly, any of the N quantized amplitude levels may be achieved by setting desirable amplification gains in the plurality of amplifiers, for example amplifier 410, 412 and 414. In addition, the amplitude control block 408 may also control a gain at amplifier 416. The amplifier 416 may comprise suitable logic, circuitry and/or code that may be enabled to set a gain $d_A$ as a function of the input provided by the amplitude control 408.

As illustrated in FIG. 4, a calibration signal c(t) may be added to the amplitude offset $d_A$. This signal may be generated in the amplitude control block 408. In this instance, the amplitude control block 408 may comprise suitable logic, circuitry and/or code that may be enabled to generate a calibration signal c(t) that may control the gain of the amplifier 416, particularly a calibration gain. The calibration signal c(t) may be used in conjunction with the amplitude offset $d_A$ and may be utilized, for example, to compensate for various amplitude distortions in the system. For example, the amplifiers 410, 412 and/or 414 may introduce some distortion, which may be compensated for by adaptively adjusting the amplitude calibration signal c(t). In addition, the variation in the gain, for example an amplitude offset gain and a calibration gain, of the amplifier 416 that may be controlled by $d_A + c(t)$ may be used, for example, to set a desirable operating point for the output signal s(t). Setting the operating point or operating region may allow one or more amplifiers, for example amplifiers 410 through 416 to operate in an efficient operating mode. In some instances, it may be desirable to use only a few discrete levels for c(t), for example corresponding to various operating modes. In these instances, a set of desirable settings for c(t) may be calibrated and stored in a look-up table. The use of memory in the form of a look-up table, for example, may avoid frequent recalibration for the calibration signal c(t) for the different modes.

Figure 5:
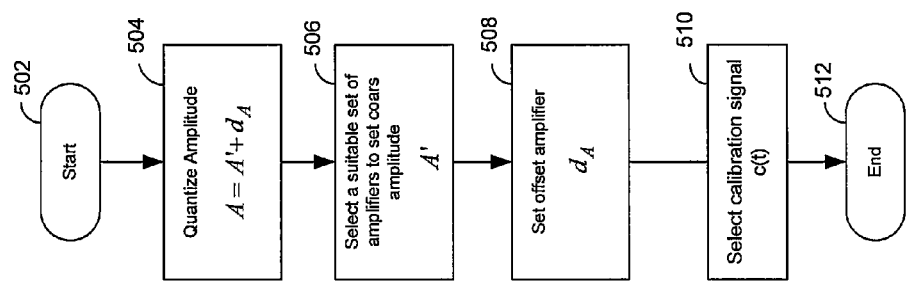
FIG. 5 is a flow chart of an exemplary polar amplitude modulation process, in accordance with an embodiment of the invention.

FIG. 5 is a flow chart of an exemplary polar amplitude modulation process, in accordance with an embodiment of the invention. Given a desired amplitude level A, the amplitude quantization process in accordance with an embodiment of the invention may be started in step 502. In step 504, the desired amplitude level may be written in terms of a coarse quantized amplitude level A' and an amplitude offset $d_A$: $A = A' + d_A$. Based on the quantized amplitude level $A' \in \{A_1, \ldots, A_N\}$, which may be chosen from a set of amplitudes, a set of amplifiers, for example amplifiers 410 through 414, may be set to achieve coarse polar amplitude modulation in step 506. In step 508, another amplifier, for example amplifier 416 may be used to generate the amplitude offset $d_A$. In step 510, the calibration signal c(t) may be selected and/or generated in function of the operating mode, for example, as described for FIG. 4. Step 512 may complete one cycle of amplitude adjustment, according to various embodiments of the invention.

In accordance with an embodiment of the invention, a method and system for amplitude calibration for polar modulation with discontinuous phase may comprise amplifying a signal, for example the output signal of adder 406, via a plurality of amplifiers, for example amplifiers 410, 412, 414 and 416 such that a combined gain of the plurality of amplifiers comprises a coarse amplitude gain A', an amplitude offset gain $d_A$ and a calibration gain c(t). A gain of one or more of the plurality of amplifiers may be adjusted to set the coarse amplitude gain A', and a gain of one or more of remaining ones of the plurality of amplifiers may be adjusted to set the amplitude offset gain $d_A$ and the calibration gain c(t).

The setting of the coarse amplitude gain, the calibration gain and/or the amplitude offset gain may be adjusted dynamically and/or adaptively, for example, through the coarse amplitude select block 418 and/or the amplitude control block 408. The gain of the one or more of the plurality of amplifiers associated with the coarse amplitude gain may switch between unity gain and an arbitrary fixed gain. The gain of one or more of the remaining ones of the plurality of amplifiers associated with the amplitude offset gain and the calibration gain may be variable and arbitrary or discrete, as explained for FIG. 4. The corresponding amplifiers associated with the amplitude offset gain and the calibration gain, for example amplifier 416, may comprise one or more analog amplifiers. The signal may be generated by phase-modulation of a radio-frequency carrier. The combined gain of the plurality of amplifiers may be controlled based on a desired amplitude modulation and a desired calibration, as described for FIG. 4. The calibration gain may be adjusted to attenuate or mitigate a signal distortion.

Another embodiment of the invention may provide a machine-readable storage, having stored thereon, a computer program having at least one code section executable by a machine, thereby causing the machine to perform the steps as described herein for a method and system for amplitude calibration for polar modulation with discontinuous phase.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a)

conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing communication signals, the method comprising:
   amplifying a signal via a plurality of amplifiers such that a combined gain of said plurality of amplifiers comprises a coarse amplitude gain, an amplitude offset gain and a calibration gain;
   adjusting, based on a first control signal, a gain of one or more of said plurality of amplifiers to set said coarse amplitude gain; and
   adjusting, based on a second control signal, a gain of one or more of remaining ones of said plurality of amplifiers to set said amplitude offset gain and said calibration gain, wherein said second control signal comprises an amplitude offset component and a calibration component.

2. The method according to claim 1, comprising dynamically adjusting said first control signal and/or said second control signal.

3. The method according to claim 1, comprising adaptively adjusting said first control signal and/or said second control signal.

4. The method according to claim 1, comprising switching said gain of said one or more of said plurality of amplifiers associated with said coarse amplitude gain between unity gain and an arbitrary fixed gain.

5. The method according to claim 1, wherein said gain of said one or more remaining ones of said plurality of amplifiers associated with said amplitude offset gain and said calibration gain is variable and arbitrary.

6. The method according to claim 1, wherein said gain of said one or more remaining ones of said plurality of amplifiers associated with said amplitude offset gain and said calibration gain is variable and discrete.

7. The method according to claim 1, wherein said one or more remaining ones of said plurality of amplifiers associated with said amplitude offset gain and said calibration gain comprise one or more an analog amplifiers.

8. The method according to claim 1, comprising generating said signal by phase-modulating a radio-frequency carrier.

9. The method according to claim 1, comprising controlling said combined gain of said plurality of amplifiers based on a desired amplitude modulation and a desired calibration.

10. The method according to claim 1, comprising adjusting said calibration component based on distortion introduced by said one or more of said plurality of amplifiers.

11. A system for processing communication signals, the system comprising:
    one or more circuits comprising a plurality of amplifiers, said one or more circuits enable:
    amplification of a signal via a plurality of amplifiers such that a combined gain of said plurality of amplifiers comprises a coarse amplitude gain, an amplitude offset gain and a calibration gain;
    adjustment, based on a first control signal, of a gain of one or more of said plurality of amplifiers to set said coarse amplitude gain; and
    adjustment, based on a second control signal, of a gain of one or more remaining ones of said plurality of amplifiers to set said amplitude offset gain and said calibration gain, wherein said second control signal comprises an amplitude offset component and a calibration component.

12. The system according to claim 11, wherein said one or more circuits dynamically adjust said first control signal and/or said second control signal.

13. The system according to claim 11, wherein said one or more circuits adaptively adjust said first control signal and/or said second control signal.

14. The system according to claim 11, wherein said one or more circuits switch said gain of said one or more of said plurality of amplifiers associated with said coarse amplitude gain between unity gain and an arbitrary fixed gain.

15. The system according to claim 11, wherein said gain of said one or more remaining ones of said plurality of amplifiers associated with said amplitude offset gain and said calibration gain is variable and arbitrary.

16. The system according to claim 11, wherein said gain of said one or more remaining ones of said plurality of amplifiers associated with said amplitude offset gain and said calibration gain is variable and discrete.

17. The system according to claim 11, wherein said one or more remaining ones of said plurality of amplifiers associated with said amplitude offset gain and said calibration gain comprise one or more analog amplifiers.

18. The system according to claim 11, wherein said one or more circuits generate said signal by phase-modulating a radio-frequency carrier.

19. The system according to claim 11, wherein said one or more circuits control said combined gain of said plurality of amplifiers based on a desired amplitude modulation and a desired calibration.

20. The system according to claim 11, comprising adjusting said calibration component based on distortion introduced by said one or more of said plurality of amplifiers.

* * * * *